(12) United States Patent
Kendall et al.

(10) Patent No.: US 12,069,869 B2
(45) Date of Patent: Aug. 20, 2024

(54) MEMRISTIVE DEVICE

(71) Applicant: Rain Neuromorphics Inc., San Francisco, CA (US)

(72) Inventors: Jack David Kendall, Millbrae, CA (US); Suhas Kumar, Mountain View, CA (US); Nikita Gaur, Sunnyvale, CA (US)

(73) Assignee: Rain Neuromorphics Inc., San Francisco, CA (US)

( * ) Notice: Subject to any disclaimer, the term of this patent is extended or adjusted under 35 U.S.C. 154(b) by 7 days.

(21) Appl. No.: 17/889,276

(22) Filed: Aug. 16, 2022

(65) Prior Publication Data

US 2023/0023533 A1    Jan. 26, 2023

Related U.S. Application Data

(63) Continuation of application No. 16/794,187, filed on Feb. 18, 2020, now Pat. No. 11,450,712.

(51) Int. Cl.
*H01L 45/00* (2006.01)
*H10B 63/00* (2023.01)
*H10N 70/00* (2023.01)
*G06N 3/063* (2023.01)

(52) U.S. Cl.
CPC .......... *H10B 63/80* (2023.02); *H10N 70/011* (2023.02); *H10N 70/841* (2023.02); *G06N 3/063* (2013.01)

(58) Field of Classification Search
CPC ............................. H10N 70/821; H10N 70/841
See application file for complete search history.

(56) References Cited

U.S. PATENT DOCUMENTS

| | | | |
|---|---|---|---|
| 5,613,042 | A | 3/1997 | Chung |
| 7,219,085 | B2 | 5/2007 | Buck |
| 8,433,665 | B2 | 4/2013 | Tang |
| 10,430,493 | B1 | 10/2019 | Kendall |
| 11,450,712 | B2 * | 9/2022 | Kendall ................ H10N 70/20 |
| 2004/0153426 | A1 | 8/2004 | Nugent |
| 2007/0257246 | A1 | 11/2007 | Bakkers |

(Continued)

FOREIGN PATENT DOCUMENTS

| | | |
|---|---|---|
| JP | 09185596 | 7/1997 |
| JP | 2003263624 | 9/2003 |

(Continued)

OTHER PUBLICATIONS

Bellew et al., Programmability of Nanowire Networks, Nanoscale, Royal Society of Chemistry, Apr. 30, 2014, pp. 9632-9639.

(Continued)

*Primary Examiner* — Mark V Prenty
(74) *Attorney, Agent, or Firm* — Van Pelt, Yi & James LLP

(57) ABSTRACT

A memristive device and mechanisms for providing and using the memristive device are described. The memristive device includes a nanowire, a plurality of memristive plugs and a plurality of electrodes. The nanowire has a conductive core and an insulator coating at least a portion of the conductive core. The insulator has a plurality of apertures therein. The memristive plugs are for the apertures. At least a portion of each of the memristive plugs resides in each of the apertures. The memristive plugs are between the conductive core and the electrodes.

1 Claim, 7 Drawing Sheets

(56) References Cited

U.S. PATENT DOCUMENTS

| | | |
|---|---|---|
| 2010/0081958 A1 | 4/2010 | She |
| 2011/0001117 A1 | 1/2011 | Lieber |
| 2011/0017977 A1 | 1/2011 | Bratkovski |
| 2011/0096589 A1 | 4/2011 | Bratkovski |
| 2011/0169136 A1 | 7/2011 | Pickett |
| 2012/0036919 A1 | 2/2012 | Kamins |
| 2012/0120714 A1 | 5/2012 | Yang |
| 2014/0151623 A1 | 6/2014 | Jeon |
| 2017/0098156 A1 | 4/2017 | Nino |
| 2017/0141302 A1 | 5/2017 | Bessonov |
| 2017/0228345 A1 | 8/2017 | Gupta |
| 2018/0046919 A1 | 2/2018 | Li |
| 2018/0309451 A1 | 10/2018 | Lu |
| 2019/0051825 A1 | 2/2019 | Vasquez |
| 2019/0311018 A1 | 10/2019 | Kendall |
| 2021/0257411 A1 | 8/2021 | David |
| 2021/0334638 A1 | 10/2021 | Nino |

FOREIGN PATENT DOCUMENTS

| | | |
|---|---|---|
| WO | 2009113993 | 9/2009 |
| WO | 2015195365 | 12/2015 |
| WO | 2017155544 | 9/2017 |
| WO | 2018217632 | 11/2018 |

OTHER PUBLICATIONS

Hu et al. (Jun. 2016). Dot-product engine for neuromorphic computing: Programming 1T1M crossbar to accelerate matrix-vector multiplication. In Proceedings of the 53rd annual design automation conference (p. 19). ACM.

Prakash et al., Resistive Switching Memory Characteristics of Ge/Geox Nanowires and Evidence of Oxygen Ion Migration, Nanoscale Research Letters, Nano Express, 2013, pp. 1-10.

Suri et al., Bio-Inspired Stochastic Computing Using Binary CBRAM Synapses, IEEE Transactions on Electron Devices, vol. 60, No. 7, Jul. 2013, pp. 2402-2409.

Wei Lu, Image Processing 1,000 Times Faster is Goal of New $5M Contract, Michigan Engineering, Aug. 14, 2013.

\* cited by examiner

MEMRISTIVE DEVICE

CROSS REFERENCE TO OTHER APPLICATIONS

This application is a continuation of U.S. patent application Ser. No. 16/794,187 entitled MEMRISTIVE DEVICE filed Feb. 18, 2020 which is incorporated herein by reference for all purposes.

BACKGROUND OF THE INVENTION

Crossbar arrays include multiple inputs and outputs. Each input is connected to each output at each crossing via a resistance. Although crossbar arrays may rapidly perform operations for a variety of computing applications, there are drawbacks to their use. For example, crossbar arrays require spatial resources on-chip that scale on the order of the square of the number inputs. Circuitry for which consumption of resources scales quadratically with the number of inputs is undesirable. Accordingly, what is desired is a mechanism that maintains the benefits of crossbar arrays such as shorter computation times, while reducing the consumption of spatial resources. Components usable in such mechanisms are also desired.

BRIEF DESCRIPTION OF THE DRAWINGS

Various embodiments of the invention are disclosed in the following detailed description and the accompanying drawings.

DETAILED DESCRIPTION

Figure 1A:
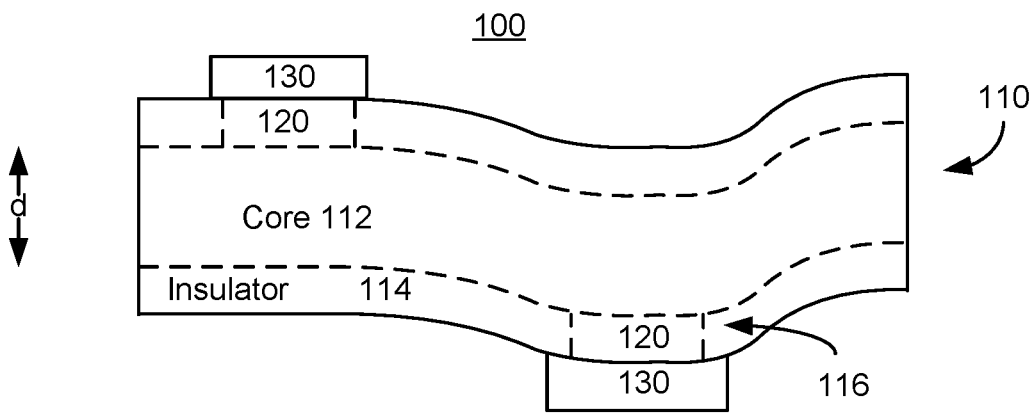
FIGS. 1A-1B depict side and cross-sectional views of an exemplary embodiment of a memristive device.

The invention can be implemented in numerous ways, including as a process; an apparatus; a system; a composition of matter; a computer program product embodied on a computer readable storage medium such as a tangible computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Crossbar arrays are utilized in a variety of computing applications. For example, in machine learning, multiple layers of vector-matrix multiplication operations may be performed by multiple layers of crossbar arrays. In such an application, input signals form the input vector that is provided to the inputs of the crossbar array. The input signals may be data for a still image, video image frames and/or another data set. The input signals are multiplied by a matrix of weights. The matrix of weights is provided by resistances at the crossings between the inputs and outputs. The outputs signals are the result of the vector-matrix multiplication operations on the input signals and form the output vector. The output vector may be provided as an input vector to the next crossbar array. This progression continues until processing is completed.

Memristors can provide the resistances, or weights, between the inputs and outputs of a crossbar array. A memristor has a resistance that can depend upon previous currents driven through the device. Thus, the memristor provides a programmable weight for the crossbar array. A crossbar array including memristors is typically formed photolithographically. A first layer includes the inputs, a second layer includes the resistances such as memristors that may be fabricated using photolithography, and a third layer includes the outputs. Typically, the outputs in the third layer are oriented perpendicular to the inputs.

For n input signals, crossbar arrays scale spatially on the order of $n^2$. Thus, although they can reduce computation time, crossbar arrays can consume significant spatial resources. Such a rapid scaling of spatial resources with the number of inputs is undesirable. Consequently, what is desired is a mechanism that may perform operations performed by crossbar arrays with reduced computation time, while moderating the consumption of spatial resources. Further, circuit components capable of use in such a mechanism are desired.

A memristive device and mechanisms for providing and using the memristive device are described. In some embodiments, the memristive device includes a nanowire, a plurality of memristive plugs and a plurality of electrodes. The nanowire has a conductive core and an insulator coating at least a portion of the conductive core. In some embodiments, the insulator conformally coats sides of the conductive core. The insulator has a plurality of apertures therein. The memristive plugs correspond to the apertures. At least a portion of each of the memristive plugs is in each of the apertures. The memristive plugs are between the conductive core of the nanowire and the electrodes. In some embodiments, other layers can be between the conductive core and the electrode. For example, barrier layers may be between memristive plugs and the conductive core of the nanowire and/or active metal layers may be between the memristive plugs and the electrodes.

The memristive device described above may be used in another memristive device that may be considered to be more highly integrated. In some embodiments, such a memristive device includes a substrate, nanowires dispersed on the substrate, memristive plugs and electrodes. Each nanowire has a conductive core and an insulator coating at least a portion of the conductive core. In some embodiments, the insulator conformally coats sides of the conductive core. The insulator for each nanowire has aperture(s) therein. At least a portion of a memristive plug is in each aperture for each nanowire. Thus, at least the portion of the memristive plug in the aperture is between an electrode and the conductive core of the nanowire. In some embodiments, the electrodes are sparsely connected via the nanowires. In some embodiments, the memristive device also includes neurons. The neurons may be between the substrate and the nanowires. The electrodes are electrically coupled with the neurons and include input electrodes and output electrodes for the neurons. In some embodiments, the memristive device further includes an insulating layer covering the nanowires, a second set of nanowires, a second set of electrodes and memristive material(s). The second set of nanowires is dispersed on the insulating layer. Each of the second set of nanowires also has conductive core. The memristive material(s) are between the conductive core and the second set of electrodes. Thus, the memristive device includes multiple layers of nanowires. Although each layer is insulated from other layers, connections between layers may be made via the electrodes. In some embodiments, additional layers having additional insulating layer(s) and additional set(s) of nanowires, electrodes and memristive material(s) may be included.

In some embodiments, nanowire(s) of the second set of nanowires include insulator coating at least a portion of the conductive core. The insulator has aperture(s) therein. In such embodiments, the memristive material(s) include memristive plug(s), at least a portion of which is in the aperture(s) for the nanowire. In some embodiments, the memristive material(s) for the second set of nanowires includes a memristive layer substantially surrounding at least a portion of the conductive core for nanowire(s) of the second set of nanowires.

A method for providing a memristive device is described. The method includes providing aperture(s) in an insulator coating at least a portion of a conductive core of a nanowire. The method also provides memristive plug(s). At least a portion of the memristive plug(s) is in the aperture(s). Electrode(s) are also provided. The memristive plug(s) are between the electrode(s) and the conductive core. In some embodiments, the insulator conformally coats the sides of the conductive core. In such embodiments, the providing the aperture further includes providing a mask layer having mask aperture(s) corresponding to aperture and etching the insulator to form the aperture. Providing the memristive plug(s) further includes depositing a memristive material on the mask layer. In some embodiments, a barrier layer is provided between the memristive plug and the conductive core of the nanowire. An active metal layer may be provided between the memristive plug and the electrode.

In some embodiments, the nanowire is one of a plurality of nanowires. Each of the nanowires has the insulator and the conductive core. In such embodiments, the nanowires are dispersed on a substrate. Providing the aperture(s) may include providing a plurality of apertures in the insulator of the nanowires. Providing the memristive plug(s) includes providing a plurality of memristive plugs such that at least a portion of each of the memristive plugs is in each of the apertures. Providing the electrode includes providing a plurality of electrodes. The memristive plugs are between the electrodes and the conductive core of the plurality of nanowires. The electrodes may be sparsely connected.

In some embodiments, the method includes providing a memristive device with multiple layers. An insulating layer covering the nanowires, memristive plugs and electrodes is provided. A second set of nanowires is dispersed on the insulating layer. Each of the second set of nanowires has a conductive core. A second set of electrodes and memristive material between the conductive core and the second set of electrodes are provided. Connection may be made to the nanowires under the insulating layer via at least some of the electrodes. In some embodiments, a nanowire of the second set of nanowires includes an insulator coating at least a portion of the conductive core. In such embodiments, the method includes providing aperture(s) in the insulator of the additional nanowire and providing the memristive material such that at least a portion of the memristive material is in the aperture(s). In some embodiments, the memristive material includes a memristive layer substantially surrounding at least a portion of the conductive core for the nanowire of the second set of nanowires.

Using the memristive devices and methods described, connection may be made to the conductive cores of nanowires via memristive plugs. In such embodiments, the remainder of core of the nanowires may be insulated by non-memristive materials. Because the nanowires may be dispersed, instead of aligned in a crossbar array, the electrodes may be sparsely coupled. In addition, the area occupied by the nanowires, electrodes and memristors may scale less dramatically with the number of inputs than in a crossbar array. Consequently, performance of a device incorporating the memristive devices and/or fabricated using the methods described herein may be improved.

Figure 1B:
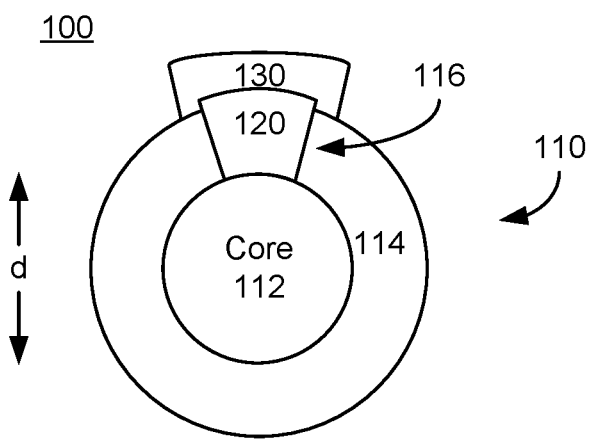

FIGS. 1A-1B depict side and cross-sectional views of an exemplary embodiment of memristive device 100. For clarity, FIGS. 1A-1B are not to scale. Memristive device 100 includes nanowire 110, memristive plugs 120 and electrodes 130. Nanowire 110 includes conductive core 112 and insulator 114. In the embodiment shown, conductive core 112 has a diameter, d. Because it is part of nanowire 110, the diameter of conductive core 112 and/or length along the axis of conductive core 112 may be constrained. For example, the diameter of conductive core 112 may be not larger than the nanometer regime. Thus, conductive core 112 may have a diameter not larger than one micrometer. In some embodiments, diameter, d, of core 112 is on the order of tens of nanometers. In some embodiments, d may be not more than ten nanometers. In some embodiments, d is at least one nanometer. In some embodiments d is at least ten nanometers and less than one micrometer. In some embodiments, the length of nanowire 110 along the axis is a least one thousand multiplied by the diameter of core 112. In other embodiments, the length of nanowire 110 may not be limited based on the diameter of conductive core 112. In some embodiments, the cross section of nanowire 110 and conductive core 112 is not circular. In some such embodiments, the lateral dimension(s) of core 112 are the same as the diameters described above. For example, the lateral dimensions may be on the order of not more than tens of nanometers. In some embodiments, the lateral dimension(s) of such a core may be at least ten nanometers and not more than one micrometer. Other lengths and/or lateral dimensions are possible for conductive core 112 and nanowire 110.

Conductive core 112 may be a monolithic (including a single continuous piece) or may have multiple constituents. For example, conductive core 112 may include multiple conductive fibers (not separately shown in FIGS. 1A-1B) which may be braided or otherwise connected together. Conductive core 112 may be a metal element or alloy, and/or other conductive material. In some embodiments, for example, conductive core 112 may include at least one of Cu, Al, Ag, Pt, other noble metals, and/or other materials capable of being formed into a core of a nanowire. For example, in some embodiments, conductive core 112 may include or consist of one or more conductive polymers (e.g. PEDOT:PSS, polyaniline) and/or one or more conductive ceramics (e.g. indium tin oxide/ITO).

Insulator 114 coats conductive core 112. In some embodiments, insulator 112 is sufficiently thick to electrically insulate conductive core 112 in the regions that insulator 114 covers conductive core 112. For example, insulator 114 may be at least several nanometers to tens of nanometers thick. In some embodiments, insulator 114 may be hundreds of nanometers thick. Other thicknesses are possible. In some embodiments, insulator 114 surrounds the sides of conductive core 112 (e.g. as shown in FIG. 1B), except at apertures 116. In other embodiments, insulator 114 may only surround portions of the sides of core conductive 112. In such embodiments, another insulator (not shown) may be used to insulate conductive core 112 from its surroundings. For example, in such embodiments, an insulating layer may be deposited on exposed portions of conductive core 112 during fabrication of a device incorporating memristive device 100. In some embodiments, a barrier layer may be provided in apertures 116. Such a barrier layer resides between conductive core 112 and memristive plug 120. Such a barrier layer may reduce or prevent migration of material between conductive core 112 and memristive plug 120. However, such a barrier layer is conductive in order to facilitate connection between conductive core 112 and electrode 130 through memristive plug 120. In some embodiments, insulator 114 includes one or more of $SiO_2$, $HfO_2$, $Ta_2O_5$, $Al_2O_3$ and polyvinylpyrrolidone (PVP)

Memristive plugs 120 reside in apertures 116. In some embodiments, memristive plugs 120 are entirely within apertures 116. In other embodiments, a portion of memristive plugs 120 is outside of aperture 116. For example, FIG. 1B depicts one embodiments in which a portion of memristive plug is outside of apertures 116 in insulator 114. In some embodiments, memristive plugs 120 may include $HfO_x$, $TiO_x$ (where x indicates various stoichiometries) and/or another memristive material. In some embodiments, memristive plugs 120 consist of HfO. Memristive plugs 120 may be monolithic, including a single memristive material. In other embodiments, multiple memristive materials may be present in memristive plugs 120. For example, memristive plugs 120 may include multiple layers of memristive materials. In other embodiments, other configurations of memristive material(s) may be used.

Electrodes 130 are used to make electrical contact to core 112 through memristive plug 114. In some embodiments, each electrode 130 includes multiple layers that can be used for various purposes. In some embodiments, electrode 130 includes Cu, Al, Ag, Pt and/or another conductive material. In some embodiments, electrode 130 consists of Pt. Electrode 130 may adjoin (e.g. share an interface with) memristive plug 120. In other embodiments, one or more conductive layers may be between electrode 130 and memristive plug 120. Electrodes 130 are shown as residing entirely outside of apertures 116. In some embodiments, a portion of electrode(s) may extend into aperture 116.

Thus, connection may be made to conductive core 112 via electrodes 130 and memristive plugs 120. Conductive core 112 provides a low resistance path between electrodes 130 and components electrically connected to electrodes 130. Consequently, memristive device 100 may be utilized to make connections to other components (not shown in FIGS. 1A-1B), where an electrically programmable resistance is desired. For example, memristive device 100 may be used in neuromorphic computing applications. Nanowires 110 may also be arranged as desired. Consequently, use of memristive device may provide flexibility in the layout and other aspects of the architecture in which memristive device 100 is desired to be used. For example, nanowires 110 may be dispersed on a substrate instead of aligned in layers with conductive lines within one layer being parallel and conductive lines in one layer being perpendicular to conductive lines in another layer. Stated differently, nanowires 110 need not be arranged in a crossbar array. Multiple memristive devices 100 may be dispersed on a substrate such that electrodes 130 are sparsely coupled. If used in such a device, the area of a substrate occupied by memristive devices 100 and their components therein may scale less dramatically with the number of inputs than for a crossbar array. Consequently, performance of a device incorporating memristive device 100 may be improved.

Figure 2A:
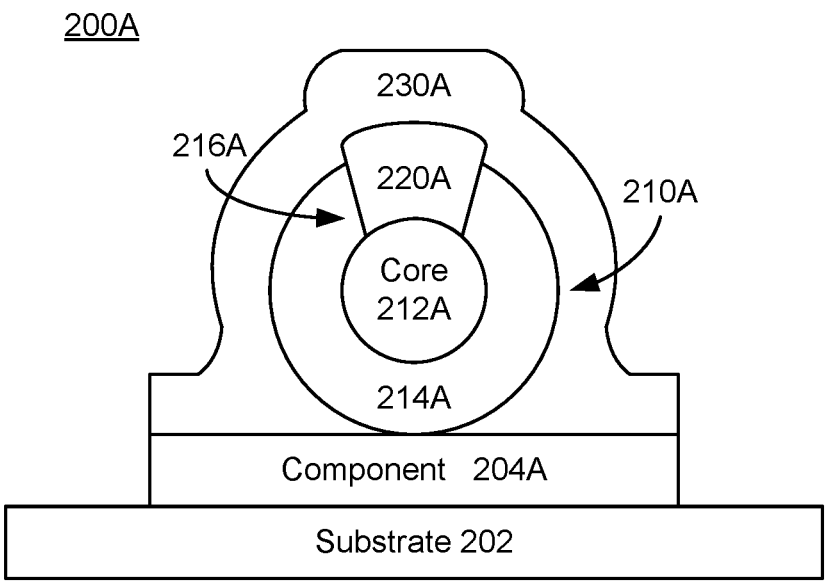
FIGS. 2A-2C depict embodiments of memristive devices.
Figure 2B:
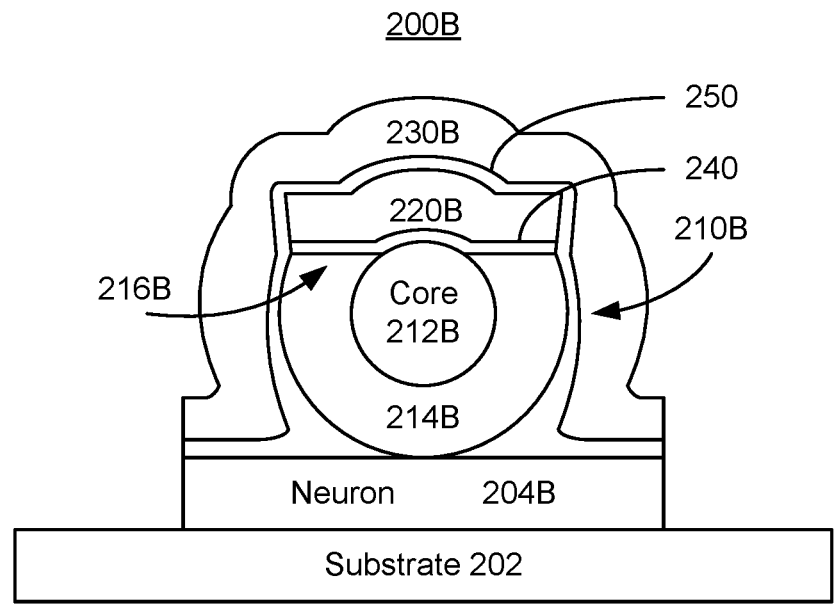
Figure 2C:
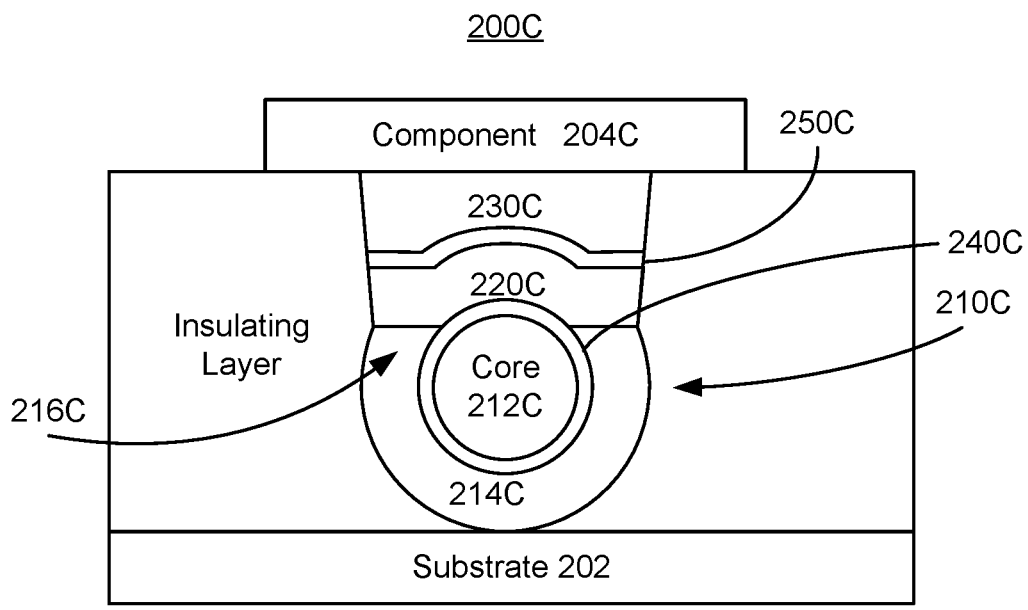

FIGS. 2A-2C depict side and cross-sectional views of embodiments of memristive devices 200A, 200B and 200C. For clarity, FIGS. 2A-2C are not to scale. Memristive devices 200A, 200B and 200C include nanowires 210A, 210B and 210C, respectively. Memristive devices 200A, 200B and 200C indicate various possible configurations of components. FIGS. 2A-2C are for exemplary purposes and not intended to depict the only possible configurations. Nanowires 210A, 210B and 210C include conductive core 212A, 212B and 212C, respectively, and insulator 214A, 214B and 214C, respectively. Nanowires 210A, 210B and 210C are analogous to nanowire 110. Thus, the dimensions of nanowires 210A, 210B and 210C are analogous to those described for nanowire 110. In addition, conductive cores 212A, 212B and 212C are analogous to conductive core 112. Insulators 214A, 214B and 214C are analogous to insulator 114. Nanowires 210A, 210B and 210C are shown on substrate 202. In some embodiments, substrate 202 may include other constituents. For example, circuit elements may be formed on or in substrate 202.

Memristive device 200A includes memristive plug 220A in aperture 216A of insulator 214A and electrode 230A. Memristive plug 220A and electrode 230A are analogous to memristive plug 120 and electrode 130. In some embodiments, memristive plug 220A is formed via photolithography. Thus, nanowire 210A and underlying structures, such as substrate 202 and component 204A, may be covered with a mask having an aperture that exposed a portion of insulator 214A. This portion may be etched and memristive plug 220A deposited. The mask may be removed after deposition of memristive plug. Electrode 230A is provided on memristive plug 220A. Because of the presence of insulator 214A, electrode 230A makes electrical connection to conductive core 212A via memristive plug 220A. Electrode 230A also makes electrical connection to component 204A. In some embodiments, component 204A may be a neuron formed on substrate 202. In other embodiments, component 204A may be another circuit element or structure.

Memristive device 200B includes memristive plug 220B in aperture 216B of insulator 214B and electrode 230B.

Memristive plug 220B and electrode 230B are analogous to memristive plug 120 and electrode 130. Thus, memristive device 200B is analogous to memristive device 200A. In addition, memristive device 200B includes barrier layer 240 and reactive metal layer 250. Barrier layer 240 may be used to reduce or prevent diffusion of material(s) in core 212B and/or insulator 214B into memristive plug 220B. For example, barrier layer 240 may be used to prevent diffusion of Cu from conductive core 212B to memristive plug 220B. In such an embodiment, barrier layer 240 may include TiN. In other embodiments, diffusion barrier 240 may be omitted. For example, if a noble metal such as Pt is used for core 212B, diffusion barrier 240 may be superfluous. Reactive metal layer 250 may be used to improve the performance of memristive plug 220B. For example, a Hf reactive metal layer 250 may be utilized for a HfO memristive plug 220B. In other embodiments, reactive metal layer may be omitted. In some embodiments, other and/or additional layers may be included between conductive core 212B and electrode 230B. In some embodiments, memristive plug 220B is formed via photolithography. Thus, nanowire 210B and underlying structures, such as substrate 202 and neuron 204B, may be covered with a mask having an aperture that exposed a portion of insulator 214B. This portion may be etched, barrier layer 220B deposited and memristive plug 220B deposited. The mask may be removed after deposition of memristive plug. Reactive metal layer 240 and electrode 230B are provided on memristive plug 220B. Because of the presence of insulator 214B, electrode 230B makes electrical connection to conductive core 212B via memristive plug 220B. Electrode 230B also makes electrical connection to neuron 204B. Thus, memristive device 200B may be part of a neuromorphic computing network. In some embodiments, nanowire 210B makes electrical connection to another neuron (not shown) via another electrode (not shown) and memristive plug (not shown).

Memristive device 200C includes memristive plug 220C in aperture 216C of insulator 214C and electrode 230C. Memristive plug 220C and electrode 230C are analogous to memristive plug 120 and electrode 130. Thus, memristive device 200C is analogous to memristive devices 200A and 200B. In addition, memristive device 200C includes barrier layer 240C and reactive metal layer 250C. Barrier layer 240C and reactive metal layer 250C are analogous to barrier layer 240 and reactive metal layer 250, respectively. In other embodiments, layers 240C and/or 250C may be omitted. In some embodiments, other and/or additional layers may be included between conductive core 212C and electrode 230C. In the embodiment shown, barrier layer 240C is part of nanowire 210C. Thus, barrier layer 240C surrounds the sides of core 212C. In some embodiments, memristive plug 220C is formed via photolithography. Thus, nanowire 210C and underlying structures, such as substrate 202, may be covered with a mask having an aperture that exposed a portion of insulator 214C. This portion may be etched, memristive plug 220C deposited, reactive metal layer 250C deposited and electrode 230C provided. The mask may then be removed. Because of the presence of insulator 214C, electrode 230C makes electrical connection to conductive core 212C via memristive plug 220C. Electrode 230C also makes electrical connection to component 204C. Component 204C may be a structure that is part of an additional layer of memristive device 200C. For example, component 204C may be an electrode for another structure to be provided.

Memristive device 200A, 200B and 200C may share the benefits of memristive device 100. Nanowires 210A, 210B and 210C may be utilized to make connections to other components 204A, 204B and/or 204C where an electrically programmable resistance is desired. For example, memristive devices 200A, 200B and/or 200C may be used in neuromorphic computing applications. Nanowires 210A, 210B and 210C may also be arranged as desired. Consequently, use of memristive device(s) 200A, 200B and/or 200C may provide flexibility in the layout and other aspects of the architecture in which memristive device(s) 200A, 200B and/or 200C are desired to be used. Multiple nanowires 210A, 210B and/or 210C may be dispersed on substrate 202 such that electrodes 230A, 230B and/or 230C are sparsely coupled. If used in such a device, the area of a substrate occupied by memristive devices 100 and their components therein may scale less dramatically with the number of inputs than for a crossbar array. Consequently, performance of a device incorporating memristive device 100 may be improved.

Figure 3A:
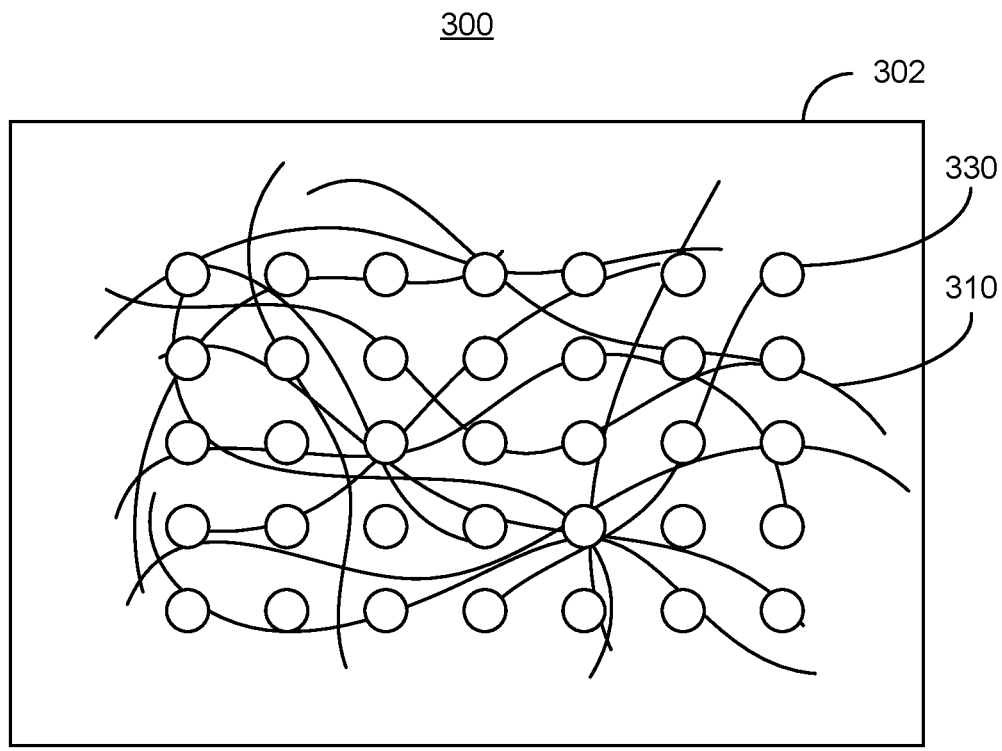
FIGS. 3A-3D depict embodiments of memristive devices incorporating nanowires.
Figure 3B:
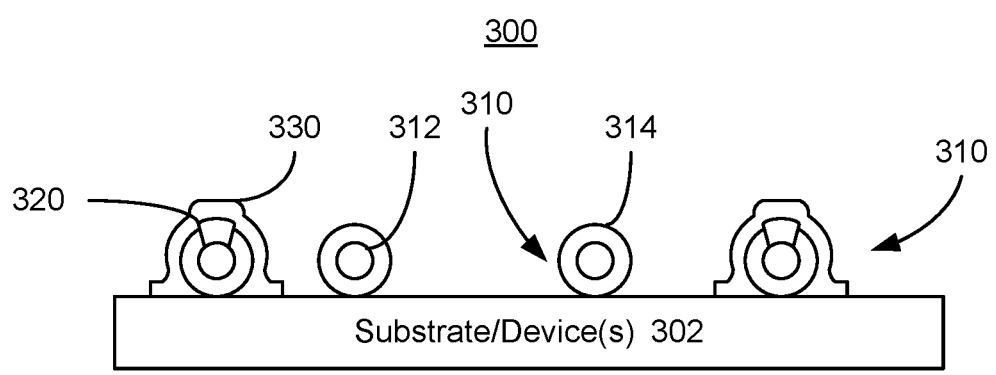

FIGS. 3A-B and 3C-3D depict plan and cross-sectional views of embodiments of memristive devices 300 and 300A. For clarity, FIGS. 3A-3D are not to scale. Referring to FIGS. 3A-3B, memristive device 300 includes nanowires 310, memristive plugs 320 and electrodes 330 on substrate 302. For simplicity, only one nanowire 310 is labeled in FIG. 3A and only two nanowires 310 are labeled in FIG. 3B. Substrate 302 may include components, including but not limited to neurons and/or other circuit elements that are fabricated in and/or on substrate 302. Nanowires 310 are analogous to nanowire(s) 110, 210A, 210B and/or 210C. Thus, conductive cores 312 are analogous to conductive core(s) 112, 212A, 212B and/or 212C and insulators 314 are analogous to insulator(s) 114, 214A, 214B and/or 214C. Memristive plugs 320 are analogous to memristive plugs 120, 220A, 220B and/or 220C. Electrodes 330 are analogous to electrodes 130, 230A, 230B and/or 230C. Thus, although particular shapes and arrangements of memristive plugs 320 and electrodes 330 are shown, other shapes and/or arrangements may be utilized.

As indicated in the cross-sectional view of FIG. 3B, not all nanowires 310 have electrodes located at the same cross-sectional cut. Although electrodes 350 are arranged in a rectangular array, memristive device 300 is not a crossbar array. Instead, nanowires 310 are dispersed on substrate 302. In some embodiments, nanowires 310 are randomly or pseudo-randomly distributed across substrate 302. In some embodiments, nanowires 310 have a distribution that is replicated multiple times across substrate. However, the arrangement of nanowires 310 in a particular replication may not be ordered. In other embodiments, the distribution of nanowires 310 may not be random or pseudo-random, but is not an ordered array. For example, two nanowires 310 may cross in multiple locations. In addition, a particular nanowire 310 need not cross every other nanowire 310 in memristive device 300. Thus, nanowires 310 are not laid out as a crossbar. As indicated by some electrodes 330 covering multiple nanowires 310 in FIG. 3A, in some embodiments an electrode 330 may form connection(s) with one or more underlying nanowires 310. Electrodes 330 may connect conductive cores 312 to circuit elements in substrate 302 via memristive plugs 320 and/or could be used to connect to additional circuit elements (not shown). Because of the arrangement of nanowires 310, electrodes 330 may be sparsely connected. Stated differently, each electrode 330 may not be connected to all of its neighbors. Although not shown in FIGS. 3A-3B, an insulating layer may be utilized to help prevent shorting and ensure that connection is made only through electrodes.

In memristive device 300, the benefits of memristive devices, such as devices 100, 200A, 200B and/or 200C, may be utilized in a more integrated circuit device. For example, memristive device 300 may be used in neuromorphic or other computing applications in which a higher density and/or sparsely coupled network is desired. Further, the area consumed by such a memristive device 300 may scale less dramatically with the number of inputs than for a crossbar array. Consequently, performance of memristive device 300 may be improved.

Figure 3C:
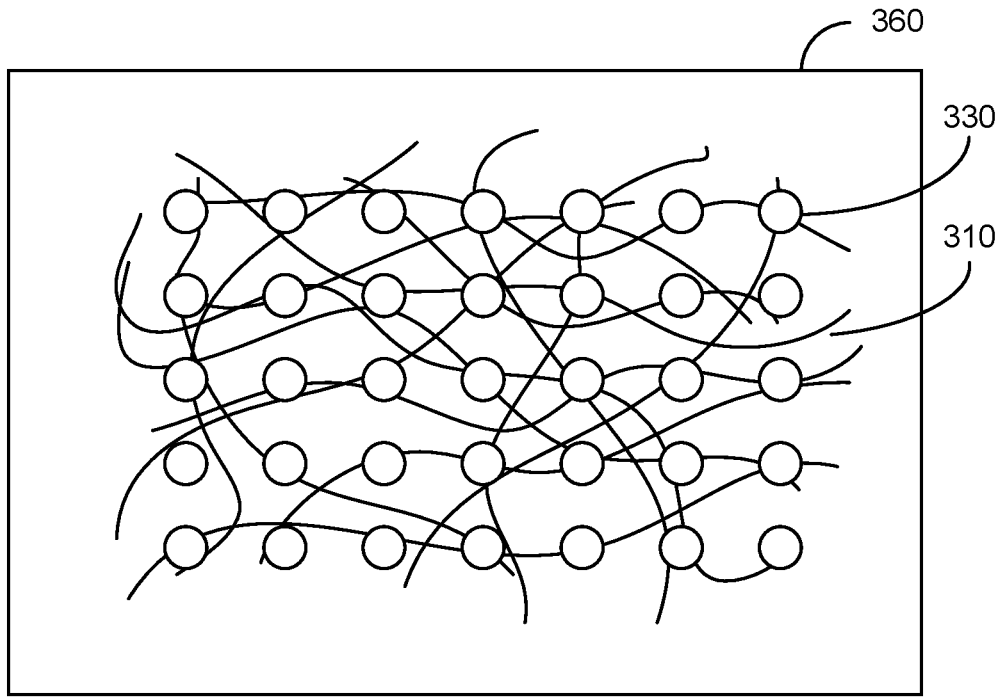
Figure 3D:
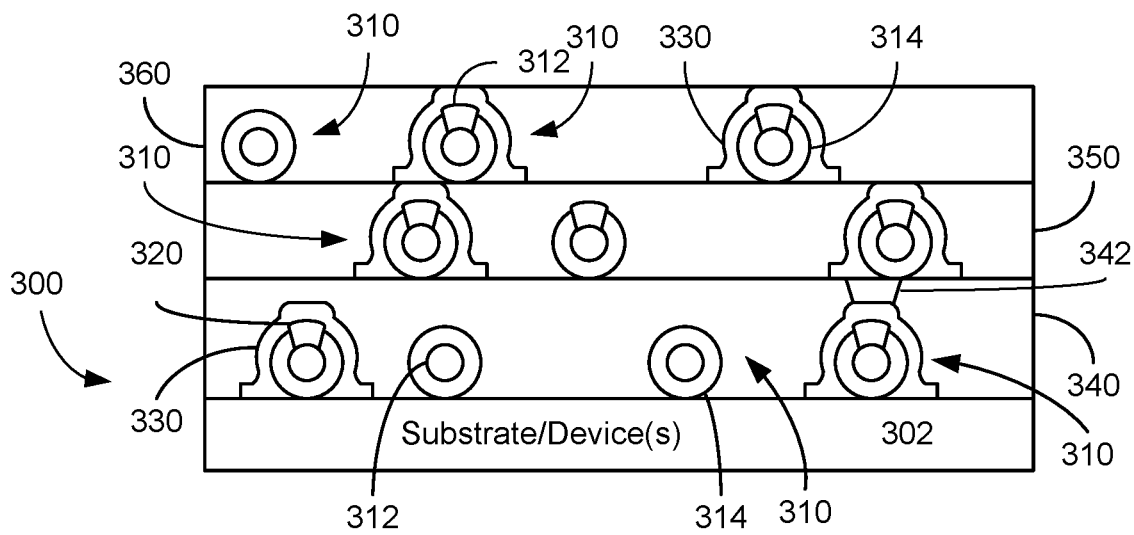

Referring to FIGS. 3C-3D, memristive device 300A is shown. Memristive device 300A incorporates memristive device 300, but includes additional layers. Thus, insulating layer 340 has been provided on the first layer of nanowires 310. A second layer of nanowires 310, memristive plugs 320, electrodes 330 and insulator 350 has also been provided. In the embodiment shown, a third layer of nanowires 310, memristive plugs 320, electrodes 330 and insulator 360 has also been provided. Thus, the plan view of FIG. 3C depicts the highest layer of electrodes 330, nanowires 310 and insulator 360. In FIG. 3B, a conductive via 342 is shown as being used to connect nanowires 310 of the first layer to components (e.g. a nanowire) in the second layer. However, electrodes 330 are shown as connecting nanowires 310 of subsequent layers to other components (e.g. other nanowires). Multiple mechanisms for connecting between nanowires 310 of different layers are thus illustrated in FIG. 3B. Other structures may be used to connect nanowires 310 to components of different layers. In other embodiments, a single mechanism for connecting nanowires 310 of different layers may be used. Further, although an analogous rectangular array of electrodes 330 is shown in FIG. 3C, in other embodiments, electrodes of different layers may have different sizes, shapes, and/or arrangements.

Nanowires 310 of subsequent layers have also been distributed in a manner analogous to that shown in FIG. 3A in that nanowires 310 are not laid out in a rectangular array. In the embodiment shown, none of the layers includes nanowires 310 arranged in an ordered array, such as a crossbar. Thus, nanowires 310 covered by insulating layers 350 and 360 may have a random, pseudo-random, or other distribution. In some embodiments, nanowires 310 have a distribution that is replicated multiple times across substrate. However, the arrangement of nanowires 310 in a particular replication may not be ordered. As can be seen from a comparison of FIGS. 3A and 3C, nanowires in different layers may be distributed differently across substrate 310. In other embodiments, the distribution of nanowires 310 may be the same in different layers. In other embodiments, nanowires 310 in at least some of the layers may be arranged in a crossbar architecture. Because nanowires 310 are dispersed as opposed to laid out in a crossbar array, electrodes 330 in multiple layers may be sparsely coupled and/or occupy an area that scales less rapidly with inputs than a crossbar array.

In memristive device 300A, the benefits of memristive devices, such as devices 100, 200A, 200B and/or 200C, may be utilized in a more integrated circuit device. Further, the benefits of memristive device 300 may be extended to a device that is vertically integrated. For example, memristive device 300A may be used in neuromorphic or other computing applications in which a higher density and/or sparsely coupled network is desired. Consequently, performance of memristive device 300A may be improved.

Figure 4:
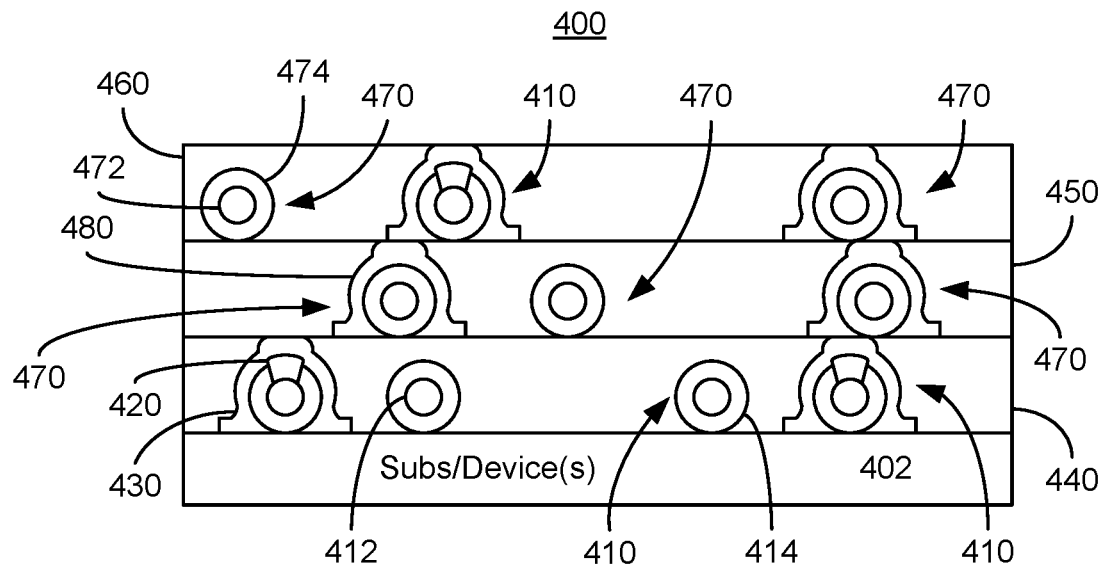
FIG. 4 depicts another embodiment of a memristive device utilizing nanowires.

FIG. 4 depicts a cross-sectional view of an embodiment of memristive device 400. For clarity, FIG. 4 is not to scale. Memristive device 400 includes nanowires 410, memristive plugs 420, electrodes 430, insulating layers 440, 450 and 460 and substrate 402. For simplicity, only some components are labeled in FIG. 4. Substrate 402 may include components, including but not limited to neurons and/or other circuit elements that are formed in and/or on substrate 402. Nanowires 410 are analogous to nanowire(s) 110, 210A, 210B, 210C and/or 310. Thus, conductive cores 412 are analogous to conductive core(s) 112, 212A, 212B, 212C and/or 312 and insulators 414 are analogous to insulator(s) 114, 214A, 214B, 214C and/or 314. Memristive plugs 420 are analogous to memristive plugs 120, 220A, 220B, 220C and/or 320. Electrodes 430 are analogous to electrodes 130, 230A, 230B, 230C and/or 330. Thus, although particular shapes and arrangements of memristive plugs 420 and electrodes 430 are shown, other shapes and/or arrangements may be utilized.

Memristive device 400 also includes nanowires 470 and electrodes 480. Nanowires 470 include a conductive core 472 and memristive layer 474. In addition, nanowires 470 may have dimensions in the same range(s) as described herein. In some embodiments, conductive core 472 is analogous to conductive core(s) 112, 212A, 212B, 212C and 312. Memristive layer 474 is utilized in place of the combination of an insulator that is part of the nanowire and a memristive plug. Memristive layer 474 may be a multilayer or other structure including one or more memristive materials. In some embodiments, memristive layer 474 substantially surrounds conductive core 472. In other embodiments, memristive layer 474 may include gaps that may expose the underlying conductive core 472. Although not shown, barrier layers, reactive metal layers and/or other layers might be incorporated into nanowire 470 and/or electrodes 480. For nanowires 470, the memristive material is considered part of the nanowire instead of an addition component provided after distribution of the nanowires. In the layer covered by insulator 450, only nanowires 470 are used. In the layer covered by insulator 460, nanowires 410 and nanowires 470 are both utilized. Thus, various combinations of nanowires 410 and/or 470 may be used in one or more layers of a memristive device such as memristive device 400. Further, other configurations in which memristive material is part of the conductive path between an electrode and a conductive core of a nanowire are possible.

Although electrodes 430 and 480 are arranged in a rectangular array, memristive device 400 may not be a crossbar array. Instead, nanowires 410 and/or 470 may be dispersed in each layer. In some embodiments, nanowires 410 and/or 470 are randomly or pseudo-randomly distributed across substrate 302. In some embodiments, nanowires 410 and/or 470 have a distribution that is replicated multiple times across substrate. However, the arrangement of nanowires 410 and/or 470 in a particular replication may not be ordered. In other embodiments, the distribution of nanowires 410 and/or 470 may not be random or pseudo-random, but is not an ordered array. For example, two nanowires 410 and/or 470 may cross in multiple locations. In addition, a particular nanowire 410 and/or 470 need not cross every other nanowire 410 and/or 470 in memristive device 400. Thus, nanowires 410 and 430 are not laid out as a crossbar. In some embodiments, an electrode 430 and/or 480 may form connection(s) with one or more underlying nanowires 410 and/or 480. Electrodes 430 and 480 may connect conductive cores 412 and/or 472 to circuit elements including but not limited to other nanowires via memristive plugs 420 and/or memristive layers 272 respectively. Because of the arrangement of nanowires 410 and 470, electrodes 430 and 480 may be sparsely connected. Stated differently, each electrode 430 and/or 480 may not be connected to all of its neighbors. Insulating layers 440, 450 and 460 may be utilized to help prevent shorting and ensure that connection is made only through electrodes. Connection between layers is shown only via electrodes 430 and 480. However, in some embodiments, other structures such as conductive vias might be used to connect layers and/or components.

Thus, a particular layer of memristive device 400 includes nanowires 410 only (the layer insulated by insulating layer 470) or nanowires 410 and 470 (the layers insulated by insulating layers 450 and 460). In some embodiments, one or more layers of memristive device 400 may include only nanowires 470. Further, although the bottom layer of memristive device 400 includes only nanowires 410, in other embodiments, other and/or additional nanowires might be included. Thus, a memristive device such as memristive device 400 may include in a particular layer only nanowires 410, nanowires 410 and 470, only nanowires 470, and/or nanowires 410 and/or 470 in combination with other nanowires and/or other components.

In memristive device 400, the benefits of memristive devices such as nanowires 410 in combination with memristive plugs 420 and/or nanowires 480, may be utilized in a more integrated circuit device. For example, memristive device 400 may be used in neuromorphic or other computing applications in which a higher density and/or sparsely coupled network is desired. Further, the area consumed by such a memristive device 400 may scale less dramatically with the number of inputs than for a crossbar array. Consequently, performance of memristive device 400 may be improved.

Figure 5:
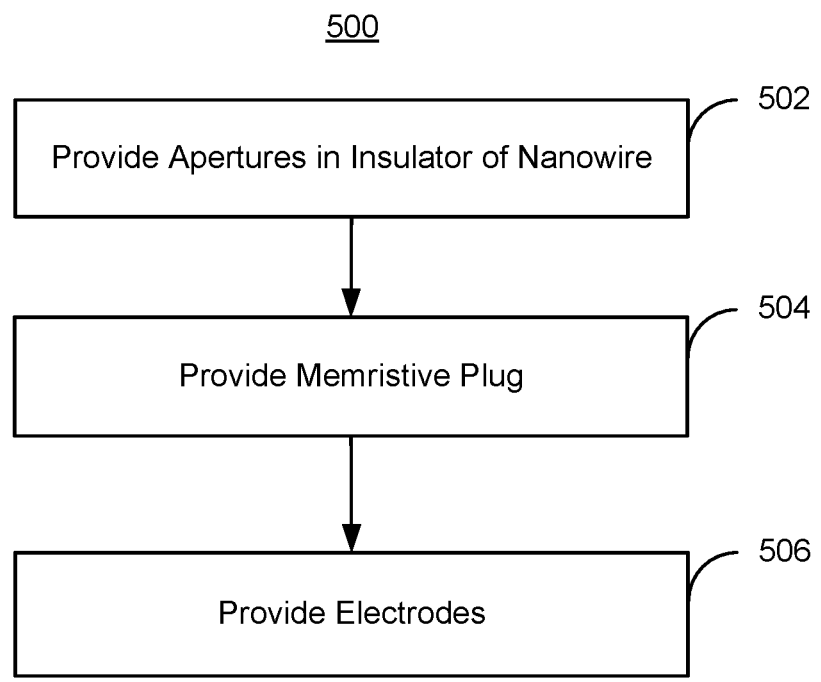
FIG. 5 is flow chart depicting an embodiment of a method for providing a memristive device.

FIG. 5 is a flow chart depicting an embodiment of method 500 for providing a memristive device. For clarity, only some processes are shown. In some embodiments, processes may be carried out in another order including in parallel and/or include multiple substeps. Method 500 is described in the context of memristive device 100. However, method 500 may be used in connection with other memristive devices. Method 500 commences after fabrication of nanowires including conductive cores and insulators.

Apertures are provided in the insulator of a nanowire including a conductive core and an insulator at least partially covering the conductive core, at 502. In some embodiments, 502 may include providing a mask that exposes a portion of the insulator in which the apertures are desired to be formed. In some embodiments, the nanowire is affixed to a substrate or other structure prior to 502. The insulator may be etched to form the apertures. Thus, the conductive core is exposed by the apertures. The mask may be removed after 502 or may remain for subsequent processing.

Memristive plugs are provided, at 504. In some of the embodiments, only a portion of a memristive plug is in the corresponding aperture. In other embodiments, all of the memristive plug is in the corresponding aperture. In some embodiments, 504 includes depositing one or more memristive layers. If no mask was present before 504, then a mask may be provided prior to depositing the memristive layer(s). The mask may be removed after 504.

Electrodes are provided, at 506. One or more layer(s) for the electrodes may be deposited at 506. For example, a reactive metal layer and/or other layer(s) desired might be provided at 506. In some embodiments, the mask used in forming memristive plugs is utilized for depositing the electrodes at 506. In such embodiments, the electrodes and memristive plugs may be self-aligned. In other embodiments, another mask may be used to form electrodes at 506. After formation, the mask may be removed.

For example, a mask may be provided on nanowire 110 at 502 and apertures 116 formed. Memristive plug 120 may then be fabricated at 506. In some embodiments, the mask used to form apertures 116 is removed and a new mask provided. In some embodiments, the same mask may be used for formation of apertures 116 is used for memristive plugs 120. One or more layers of memristive material are provided, at 504. The mask may then be removed. In some embodiments, a new mask is provided for formation of electrodes 130. In some embodiments, however, the same mask is used for electrodes 130 as for memristive plugs 120. Conductive layer(s) for electrode 130 are provided. Thus, using method 500 memristive devices, such as memristive device 100 may be fabricated and the benefits thereof achieved.

Figure 6:
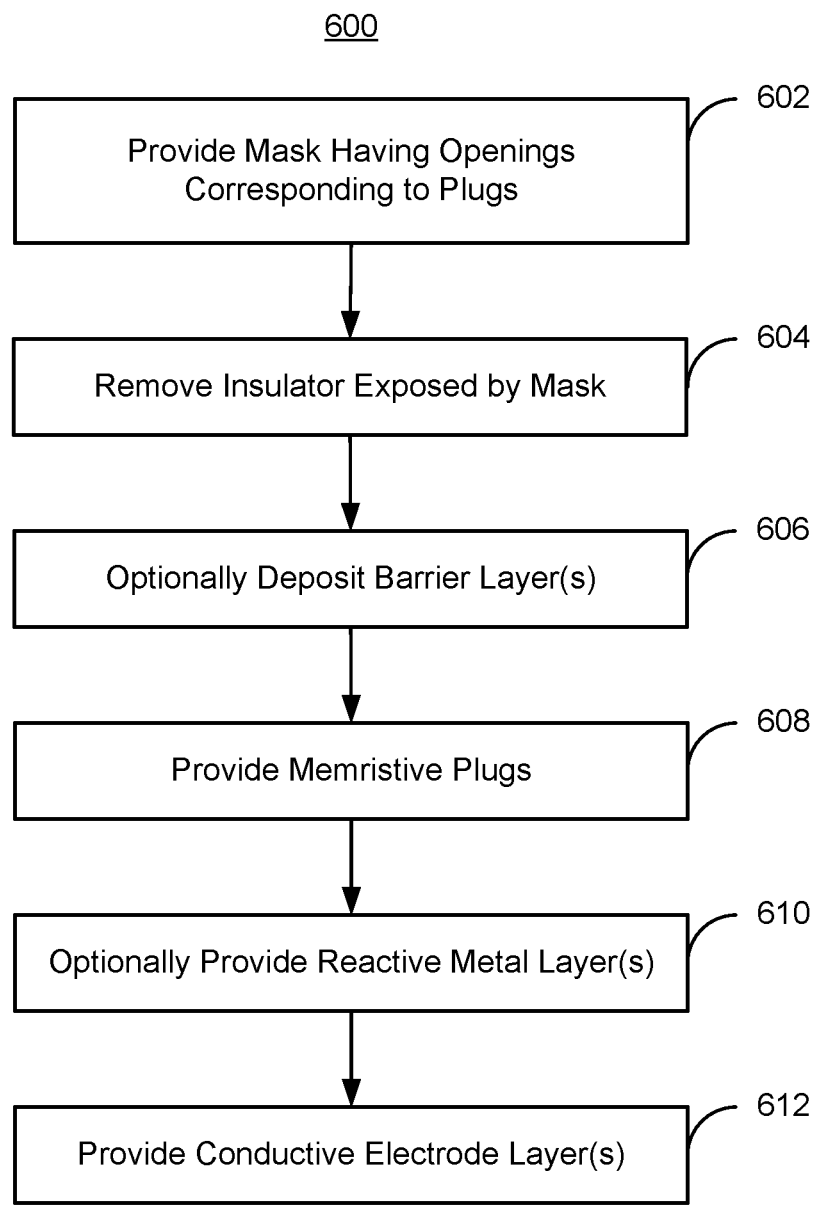
FIG. 6 is a flow chart depicting another embodiment of a method for providing memristive devices.

FIG. 6 is flow chart depicting an embodiment of method 600 for providing a memristive device. For clarity, only some processes are shown. In some embodiments, processes may be carried out in another order including in parallel and/or include multiple substeps. Method 600 is described in the context of memristive device 200B. However, method 600 may be used in connection with other memristive devices. Method 600 commences after fabrication of nanowires including conductive cores and insulators.

A mask having openings in locations corresponding to memristive plugs is provided, at 602. In some embodiments, 602 is performed utilizing photolithographic techniques. Portions of the insulator exposed by openings in the mask are etched, at 604. Thus, apertures exposing the underlying core are formed. One or more barrier layers may be provided, at 606. Thus, diffusion between the core and subsequent layer(s) may be prevented. In some embodiments, 606 includes removing the mask used to form the apertures either before or after deposition of the barrier layer(s). In other embodiments, the mask may remain for subsequent process(es).

Memristive plug(s) are provided, at 608. One or more memristive layers may be deposited at 608. If the mask used in 604 has been removed, then a new mask may be provided prior to 608. Alternatively, the memristive layer(s) may be deposited and portions of the memristive layer(s) distal from the apertures may be removed. The mask may be removed after 608.

One or more reactive metal layers may be provided at 610. For example, a Hf layer may be deposited. The layer(s) for the electrodes are provided, at 612. In some embodiments, a new mask having openings corresponding to the electrode locations may be provided prior to 612 and then removed such that electrodes are formed in the desired locations. In some embodiments, the same mask used at 608 or 610 is used. In other embodiments, the reactive metal and/or electrode layers maybe deposited and then portions of these layer distal from the locations of the electrode removed.

For example, a mask may be provided on nanowire 210B at 602 and apertures formed at 604. Barrier layer 240 and memristive plug 220B may then be fabricated at 506. In some embodiments, the same mask used to form apertures in insulator 212B is used for 606 and 608. In some embodiments, the mask may be removed after 608. In some embodiments, a new mask is provided for formation of electrodes 230B. In some embodiments, however, the same mask is used for electrodes 230B as for memristive plugs 220B. Reactive metal layer(s) are deposited at 610 and additional highly conductive layer(s) for electrode 230B are provided. Thus, using method 600 memristive devices, such as memristive device(s) 200B and/or 200C may be fabricated and the benefits thereof achieved.

Figure 7:
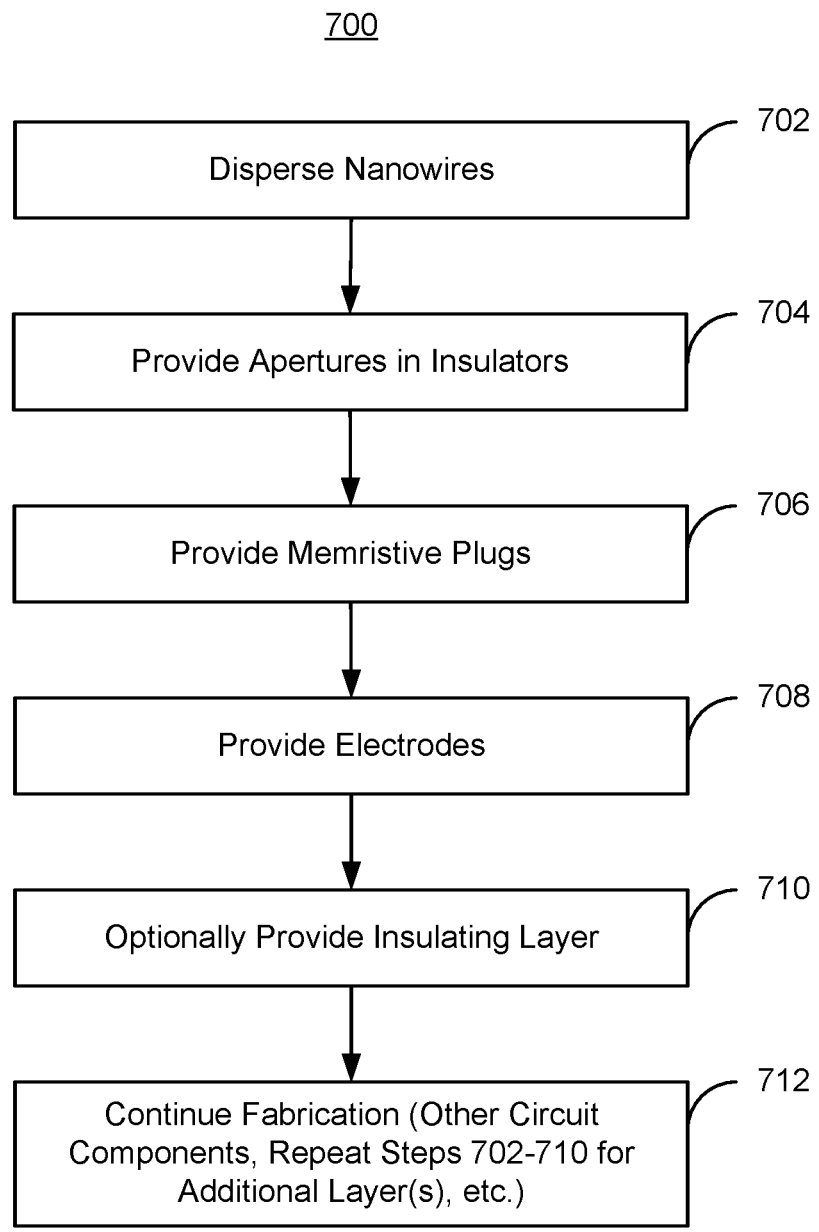
FIG. 7 is a flow chart depicting another embodiment of a method for providing memristive devices.

FIG. 7 is a flow chart depicting an embodiment of method 700 for providing a memristive device. For clarity, only some processes are shown. In some embodiments, processes may be carried out in another order including in parallel and/or include multiple substeps. Method 700 is described in the context of memristive device 300A. However, method 700 may be used in connection with other memristive devices. Method 700 commences after fabrication of nanowires including conductive cores and insulators.

Nanowires are dispersed across a surface, at 702. In some embodiments, nanowires are also affixed to the surface at 702. Dispersal of the nanowires may include distributing the nanowires such that the nanowires do not form an ordered (e.g. crossbar) array.

Apertures are provided in the insulating layer(s) of the nanowires, at 704. In some embodiments, 704 includes providing a mask having openings in the desired locations of the electrodes. The exposed portions of the memristive device, including the insulator(s), are removed. In some embodiments, the conductive core or other layers may form an etch stop for the etch used at 704. In other embodiments, a portion of the core may be removed. However, a sufficient fraction of the core remains for carrying the desired current.

Memristive plugs are provided, at 706. In some embodiments, 706 also includes providing barrier and/or other desired layer(s) between the conductive core and the memristor. Electrodes are also provided at 708. In some embodiments, additional layers may be fabricated at 708. For example, reactive metals and/or other layers may be provided at 708. In some embodiments, at least some of the additional layers are between the electrodes and memristive plug. In some embodiments, additional layer(s) may be provided on the electrode. These additional layers may be used to tailor performance of the memristive device and/or form additional circuit components. An insulating layer may be provided at 710.

Fabrication is continued, at 712. For example, conductive vias and/or other circuit components may be formed. Additional layers may also be formed. In some embodiments, one or more of the additional layer(s) may be fabricated by repeating method 702.

For example, nanowires 310 may be dispersed on substrate 302, at 702. Apertures in the insulators 314 may be formed at 704 and memristive plugs 320 formed at 706. As part of 706, barrier layer(s) and/or other layers may also be formed. Electrodes 330 are formed, at 708. Reactive metal layer(s) and/or other layers may also be formed at 708. Insulating layer 340 may be formed at 710. Fabrication is continued at 712. Thus, conductive via 342 may be formed. Additional nanowires 310 are dispersed on insulating layer 340. Additional memristive plugs 320 and electrodes 330 are formed and another insulating layer 350 formed. Barrier and reactive metal layers as well as other components may also be provided. Thus, steps 702 through 710 are iterated through. In addition, a third layer for memristive device 300A is fabricated at 712. Thus, nanowires 310 are dispersed on insulator 350, memristive plugs 320 formed in insulator 314 and electrodes 330 provided. Barrier layers, active metal layers and other structures may also be fabricated. Thus, using method 700 memristive devices, such as memristive device(s) 300 and/or 400 may be fabricated and the benefits thereof achieved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A device comprising:
   a plurality of neurons;
   a plurality of electrodes electrically coupled with the neurons;
   a plurality of nanowires, each of the plurality of nanowires having a conductive core and an insulator covering at least a portion of the conductive core, the insulator having a plurality of apertures therein; and
   a plurality of memristive plugs for the plurality of apertures, at least a portion of each of the plurality of memristive plugs residing in each of the plurality of apertures, the plurality of electrodes being electrically coupled to the plurality of nanowires through at least a portion of the plurality of memristive plugs.

* * * * *